United States Patent
Xu et al.

(10) Patent No.: US 10,361,731 B2
(45) Date of Patent: Jul. 23, 2019

(54) INTERLEAVED SIGMA DELTA MODULATOR BASED SDR TRANSMITTER

(71) Applicant: HRL Laboratories, LLC, Malibu, CA (US)

(72) Inventors: Zhiwei A. Xu, Los Angeles, CA (US); Yen-Cheng Kuan, Los Angeles, CA (US); Cynthia D. Baringer, Piedmont, CA (US); Hasan Sharifi, Agoura Hills, CA (US); James Chingwei Li, Simi Valley, CA (US); Donald A. Hitko, Grover Beach, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/828,106

(22) Filed: Nov. 30, 2017

(65) Prior Publication Data
US 2019/0165820 A1    May 30, 2019

(51) Int. Cl.
*H04B 1/04*    (2006.01)
*H03M 3/00*    (2006.01)
*H03M 7/16*    (2006.01)

(52) U.S. Cl.
CPC .............. *H04B 1/04* (2013.01); *H03M 3/502* (2013.01); *H03M 7/165* (2013.01)

(58) Field of Classification Search
CPC .......... H04B 1/02; H04B 1/04; H04B 1/0475; H03M 3/50; H03M 3/502; H03M 3/504; H03M 7/16; H03M 7/165
USPC ................ 375/130, 259, 260, 285, 295, 296
See application file for complete search history.

(56) References Cited

U.S. PATENT DOCUMENTS

| | | | |
|---|---|---|---|
| 6,476,748 B1* | 11/2002 | Galton | H03M 1/0675 341/144 |
| 9,455,737 B1 | 9/2016 | Rajaee et al. | |
| 9,543,974 B1* | 1/2017 | Yang | H03M 1/066 |
| 9,621,183 B2* | 4/2017 | Baringer | H03M 3/47 |
| 9,966,969 B1* | 5/2018 | Engel | H03M 1/66 |
| 2002/0063647 A1* | 5/2002 | Brooks | H03M 1/067 341/144 |
| 2004/0004565 A1* | 1/2004 | Melanson | H03M 7/3006 341/143 |

(Continued)

OTHER PUBLICATIONS

J.C. Scheytt, P. Ostrovskyy, H. Gustat, "RF Bandpass Delta-Sigma Modulators for Highly Efficient Class-S Transmitters in SiGe BiCMOS Technology," IEEE International Conference on Wireless Information Technology and System, 2010, pp. 1-4.

(Continued)

*Primary Examiner* — Siu M Lee
(74) *Attorney, Agent, or Firm* — Ladas & Parry

(57) ABSTRACT

A Delta-Sigma modulator architecture is disclosed that uses interleaving and dynamic matching algorithms to address the needs of multi-mode, multi-band high bandwidth transmitters. The proposed architecture also supports a novel software defined transmitter architecture based on an interleaved Delta-Sigma modulator to generate RF signals. The proposed architecture leverages interleaving concepts to relax subcomponent clock rates without changing the effective oversampling ratio, thus, making it easier to reach aggressive dynamic range goals across wider bandwidths at higher frequencies. The DEM algorithm helps to randomize mismatch errors across all interleaved paths and improves substantially the signal-to-noise ratio. Additionally, a tunable bandpass filter can be added to reject out-of-band emissions.

23 Claims, 10 Drawing Sheets

(56) References Cited

U.S. PATENT DOCUMENTS

| | | | | |
|---|---|---|---|---|
| 2004/0222909 | A1* | 11/2004 | Wang | H03H 17/02 |
| | | | | 341/144 |
| 2009/0243904 | A1* | 10/2009 | Lee | H03M 1/0673 |
| | | | | 341/144 |
| 2011/0279292 | A1 | 11/2011 | Parida et al. | |
| 2015/0373643 | A1* | 12/2015 | Talty | H04W 52/0209 |
| | | | | 370/311 |
| 2016/0020781 | A1 | 1/2016 | Baringer et al. | |
| 2016/0315648 | A1 | 10/2016 | Talty et al. | |
| 2017/0033802 | A1* | 2/2017 | O'Brien | H03M 3/422 |
| 2017/0070237 | A1 | 3/2017 | Ardalan | |
| 2017/0163295 | A1* | 6/2017 | Talty | H04B 1/0475 |

OTHER PUBLICATIONS

Pham, Jennifer, Time-interleaved ΔΣ-DAC for Broadband Wireless Applications, Master Thesis, 2007, Electrical and Computer Engineering, University of Toronto, pp. 1-146.

L. Ye, et al, "A Digitally Modulated 2.4 GHz WLAN Transmitter with Integrated Phase Path and Dynamic Load Modulation in 65 nm CMOS," IEEE ISSCC, 2013, pp. 330-331.

P.A.J. Nuyts, P. Reynaert, W. Dehaene, "A Fully Digital PWM-based 1 to 3 GHz Multistandard Transmitter in 40 nm CMOS," IEEE RFIC, 2013, pp. 419-422.

A. Arriagada, H.-y.M. Pan, Jonmei Yan, D.F. Kimball, L.E. Larson, "A Wideband High Dynamic Range Frequency Hopping Transceiver for the Joint Tactical Radio System," IEEE Military Communications Conference, 2010, pp. 2009-2013.

W. Li, K.K.M. Cheng, "A Single Inductor Approach to the Design of Low-Voltage CMOS MB-OFDM UWB Frequency Synthesizer," IEEE IMS, 2012, pp. 1-3.

Galton, Ian, "Why Dynamic-Element-Matching DACs Work", IEEE Transactions on Circuits and Systems, Feb. 26, 2010, vol. 57, No. 2, pp. 69-74.

International Search Report and Written Opinion of the International Searching Authority issued for International Application No. PCT/US2018/053645 on Feb. 1, 2019.

* cited by examiner

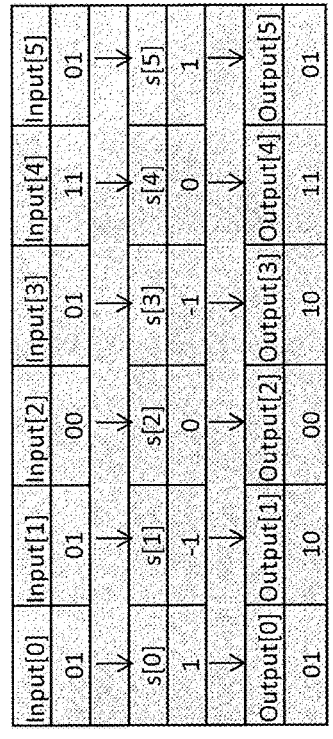
Figure 1e (Prior Art)
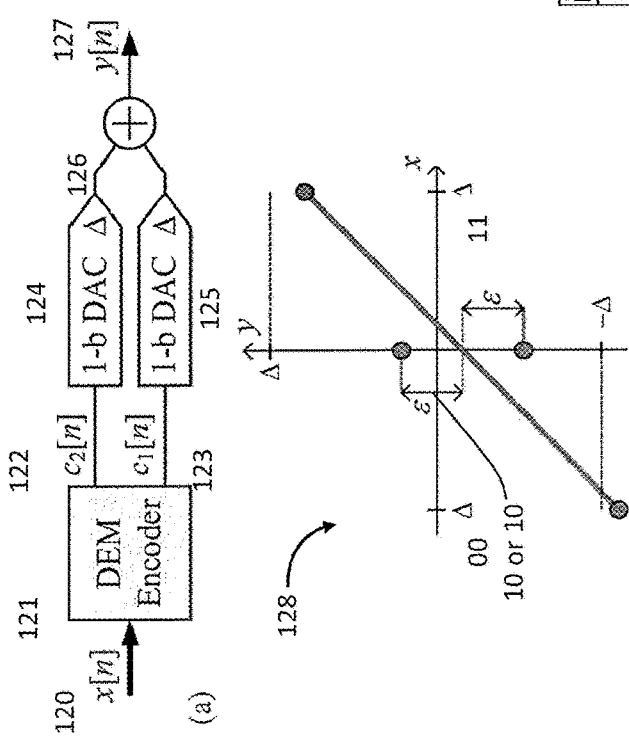
Figure 1c (Prior Art)
Figure 1d (Prior Art)
Figure 1f (Prior Art)

| Binary (B3-B0) | Thermometer (T15-T1) |
|---|---|
| 0001 | 0000000000000001 |
| 0010 | 0000000000000011 |
| 0011 | 0000000000000111 |
| 0100 | 0000000000001111 |
| 0101 | 0000000000011111 |
| 0110 | 0000000000111111 |
| 0111 | 0000000001111111 |
| 1000 | 0000000011111111 |
| 1001 | 0000000111111111 |
| 1010 | 0000001111111111 |
| 1011 | 0000011111111111 |
| 1100 | 0000111111111111 |
| 1101 | 0001111111111111 |
| 1110 | 0011111111111111 |
| 1111 | 0111111111111111 |

Figure 4

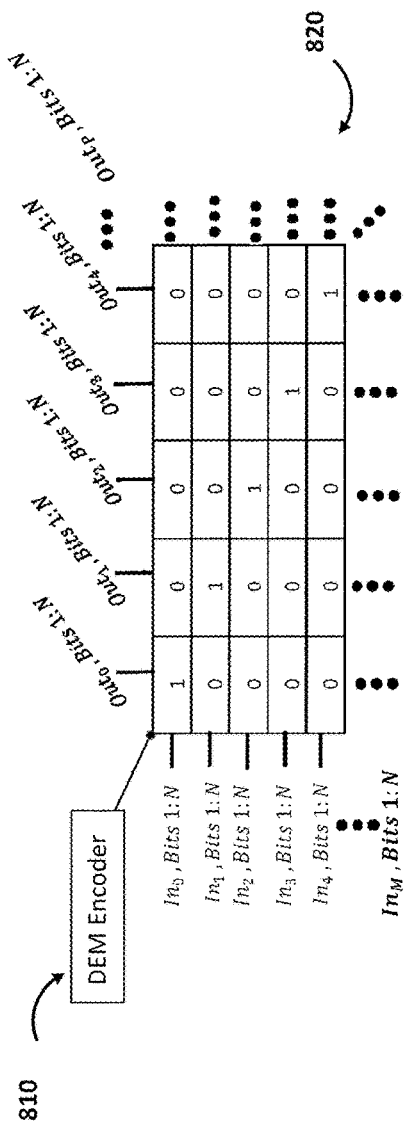
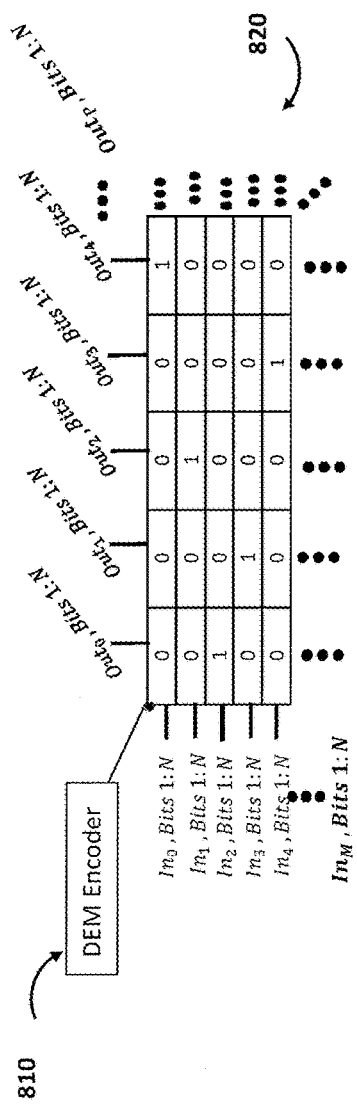
Figure 8a
Figure 8b

INTERLEAVED SIGMA DELTA MODULATOR BASED SDR TRANSMITTER

TECHNICAL FIELD

The present writing is directed in general to signal modulation for RF (radio frequency) transmission and in particular to delta-sigma modulator-based software-defined RF transmitters (SDR transmitters). All publications, including but not limited to patents and patent applications, cited in this specification are incorporated by reference as though fully set forth herein.

REFERENCE TO NON-PATENT LITERATURE

The following references are incorporated into the application.
- J. C. Scheytt, P. Ostrovskyy, H. Gustat, "RF Bandpass Delta-Sigma Modulators for Highly Efficient Class-S Transmitters in SiGe BiCMOS Technology," IEEE International Conference on Wireless Information Technology and System, 2010, pp. 1-4.
- Pham, Jennifer, "Time-interleaved ΔΣ-DAC for Broadband Wireless Applications, Master Thesis, 2007, Electrical and Computer Engineering, University of Toronto, pp. 1-146.
- L. Ye, et al, "A Digitally Modulated 2.4 GHz WLAN Transmitter with Integrated Phase Path and Dynamic Load Modulation in 65 nm CMOS," IEEE ISSCC, 2013, pp 330-331.
- P. A. J. Nuyts, P. Reynaert, W. Dehaene, "A Fully Digital PWM-based 1 to 3 GHz Multistandard Transmitter in 40 nm CMOS," IEEE RFIC, 2013, pp. 419-422.
- A. Arriagada, H.-y. M. Pan, Jonmei Yan, D. F. Kimball, L. E. Larson, "A Wideband High Dynamic Range Frequency Hopping Transceiver for the Joint Tactical Radio System," IEEE Military Communications Conference, 2010, pp. 2009-2013.
- W. Li, K. K. M. Cheng, "A Single Inductor Approach to the Design of Low-Voltage CMOS MB-OFDM UWB Frequency Synthesizer," IEEE IMS, 2012, pp. 1-3.
- Galton, Ian, "Why Dynamic-Element-Matching DACs Work", IEEE Transactions on Circuits and Systems", February 2010, Volume 57, No 2, pp. 69-74.

BACKGROUND

Transmitters are an indispensable component for radios, which have been used in cellular phones, indoor wireless local area networks (LAN) and wireless controllers. Due to emerging multi-mode and multi-band applications, a transmitter with wide-band coverage becomes necessary. Many applications require transmitters to switch rapidly between frequency bands, which impose a significant challenge to the transmitter solution.

A variety of wide-band transmitters are known. However, some of these include local oscillator (LO) based transmitters. The switching time of the LO based transmitter is often determined by the LO channel switching time under the governance of the loop bandwidth of the frequency synthesizer, which is typically around 1 MHz. Hence, the achievable channel switching time is several micro seconds which is too long of a time to be used in an agile radio application.

Alternatively, a fully digital Pulse-Width-Modulation (PWM) based multi-standard transmitter has been used. However, this PWM transmitter suffers from high distortion, and the channel switching time is still determined by the LO at the carrier frequency. As part of the evolution of multi-mode, multi-band transmitters, Direct Digital Synthesizers (DDS) have been used as the LO source to enhance switching speed, but they consume significant power and may not deliver a very high frequency LO with low spur. Another approach to get broadband coverage with fast band switching is the use of single sideband mixers to generate a number of LOs with different center frequency using a common Phase-locked loop (PLL), the channel switching time of which is relatively fast compared to prior techniques. However, this approach can only support a limited number of LO options and any additional channel mandates an addition of extra mixers.

As part of this evolution to support rapidly switching multi-band transmitters, delta-sigma modulators have been proposed to feed the RF transmitters. FIG. 1a illustrates such a bandpass delta-sigma-modulator (BDSM) 10 receiving an RF input 12 as part of an RF transmitter 1 logic. A common clock 14 drives the BDSM 10 and the modulated output of the BDSM 10 is amplified through a Power Amplifier (PA) 16 and passed through a bandpass filter 18 before being transmitted. However, the BDSM 10 in FIG. 1a cannot provide a very high dynamic range and/or wide-band operation due to a moderate clock frequency driving the BDSM 10. The clock frequency is constrained by technology and becomes a limiting factor in providing a high dynamic range or a wide-band operation in these transmitters. The limited dynamic range of such systems due to the limiting sampling clock rate does not meet even today's needs for narrow-band applications.

One of the recent techniques for a rapidly switching multi-band operation is the use of a time-interleaving, low-pass Digital-to-Analog Convertor (DAC) (shown as a circled area 102) in the transceiver 100, as illustrated in FIG. 1b. In the transmit path 114, the input data stream 103 is processed by a baseband processor 104 that generates an I and a Q for each incoming data element passed through a bank of time-interleaved DACs 106 and modulated by an intermediate frequency (IF) carrier frequency to create an IF signal 108. This IF signal 108 is taken through a Band Pass Filter (BPF) 110 and up-converted by a 60 GHz carrier frequency before being amplified by a PA 112 and transmitted via antenna 117. In this approach, higher performance at wider bandwidths than in FIG. 1a are reported. However, the architecture of FIG. 1b requires up conversion to generate the RF carrier. Latencies in LO switching times and fixed RF filter components are still bottlenecks to achieving fast band switching and further limit the reconfigurability of and usefulness in software-defined radio applications.

Referring now to FIGS. 1c-1f which discuss material from Galton, Ibid, a typical 2-bit Dynamic Element Matching (DEM) encoder DAC system encodes and/or permutes two bits of a thermometer coded digital signal at its output. The two thermometer coded bits can comprise one of the elements in {00, 01, 11} and DEM encoding can be accomplished by either randomly 1) swapping or 2) leaving in place the elements at the output, i.e. mapping the elements to the set {00, 01, 10, 11} at the output, as can be seen in FIG. 1c. A 2-bit digital signal 120 is received by a DEM Encoder 121, which encodes and separates the two bits into two digital signal paths 122 and 123, each carrying one bit that was swapped or left in place. The two digital signal paths are each received in parallel by two nominally identical 1-bit DACs 124 and 125, which can each comprise a single current switch (not shown). The two digital signals are each converted to analog signals and combined with a summing circuit 126 to produce a single outputted analog signal 127. Because the signals are summed, swapping the bits at the input of the DACs does not produce a different combined analog signal if the components within the two pathways are identical. Mismatch errors arise if the two 1-bit DACs 124 and 125 are not identical (or if components within the two pathways are not identical) and a resulting analog signal is generated containing a mismatch error in, for example, the output voltage v(t) of analog signal 127. This mismatch error can change in sign from positive to negative or negative to positive, when the bits in the aforementioned elements are swapped at the input of the DACs 124 and 125. This can be seen in graph 128 of FIG. 1d which depicts the output voltage y=v(t) being ε above or ε below the line that joins the output voltages at x=00 and x=11, where ε is the mismatch error at x=01 or 10. So, a typical 2-bit DEM would, when one of the bits of a 2-bit data signal is 1 and the other 0, either swap the bits or not swap the bits in a random, decision-making manner. Swapping them would change the sign of the mismatch error in the resulting analog signal when the digital signals are converted to analog and summed by the summing circuit. This sign in the mismatch error, which is here called s[n], can be generalized to be either +1, −1 or 0. The mismatch error can then be defined as:

$$\text{mismatch error} \equiv e_{mismatch} = s[n] \cdot e_{DAC}[n]$$

The equation above for a mismatch error contains the variable $e_{DAC}[n]$, which is either positive definite, or negative definite in this definition, and the variable's magnitude is equal to the magnitude of the mismatch error. The number [n] in this context is the sample number. The purpose of a DEM encoder is to alter the variable s[n] such that it is uncorrelated with the input of the 2 bits at the DACs, which will be described in more detail in the following paragraph.

As described in Galton 2010, Ibid, if the inputs of the 2 bits into the DEM encoder belong to the input sequence input [n]={01, 01, 00, 01, 11, 01}, one embodiment of a DEM encoder could map the sequence input [n] according to the following sequence of signs s[n]: {1, −1, 0, −1, 0, 1 ...}, as can be seen in FIG. 1e where it is observed that the two bits 01 in input [0] are not switched (s[0]=1) and the bits in input [1] are switched (s[1]=−1). Subsequently, the bits 01 in input [3] are switched (s[3]=−1) and the bits in input [5] are not switched (s[5]=1). The sign s[n]=0 could be interpreted as the bits either 1) not being switched and/or 2) not being considered by the DEM encoder, and possibly re-routed around its components. For example, s[2]=0, which corresponds to input [2]=00. The two bits in input [2] are identical and they can either be not considered by the DEM encoder and re-routed around or within its components or they can be considered and not switched. This method of encoding the bits in a digital signal according to the sequences described above and in FIG. 1f is incorporated by mismatch-shaping DEM DAC systems which spectrally shape the mismatch noise.

The determination as to whether switching occurs or not for a given input[n] can be determined by the design of the DEM encoder. The determination can be described by one or a combination of the sequences of 1) switching at a first instance of an input 01 or 10 and not switching at the second instance thereof, 2) not switching at a first instance of an input 01 or 10 and switching at the second instance thereof, 3) a combination or sequence of these sequences, or 4) no apparent sequence, with a random selection of switching or not switching. The DEM encoder system can comprise multiplexers, flip-flops, random or pseudorandom bit generators, transistors, switches, and logic gates such as XOR gates, OR gates, NOR gates, XNOR gates, AND gates, NAND gates, NOT gates, etc. The DEM encoder system can comprise a programmable circuit such as a Field-Programmable Gate Array (FPGA). The generalization of the above-simplified algorithm can be applied to higher order bits and can be realized by someone skilled in the art. This can be exemplified by using several 2-bit DEM encoders for an N-bit length data signal or by using an N-bit DEM encoder, which would swap or not swap bits or portions of the inputted N-bit data according to the design of the N-bit encoder.

The field of multi-band, multi-mode RF transmitters is in need of modulating techniques that provide for wide-band operation with fast switching without requiring a very high sampling clock.

SUMMARY

To address one or more of the above-deficiencies of the prior art, one embodiment described in this writing provides for an interleaved delta-sigma modulator comprising a set of interleaved filter banks, an interleaved DEM network, interleaved array(s) of DACs and a summing unit, wherein digital input data streaming from one or more processors is mapped to feed interleaved filter banks that drive the DEM network, then converted to analog signals by the interleaved arrays or banks of DACs and merged by the summing unit.

A method of modulating a transmit signal is also disclosed, comprising generating amplitude, frequency, and phases of digital data for one or more transmit signals with a processing unit, creating parallel interleaved pathways for the digital data, filtering the digital data through interleaved filter banks, routing the digital data through a DEM network, converting the data to analog signals through an interleaved bank of DACs and summing the analog signals from the various interleaved DAC banks.

Certain embodiments may provide various technical capabilities depending on the implementation of the embodiment. For example, a technical capability of some embodiments may include the ability to provide additional tunable band pass filtering to reject out-of-band emissions. Other implementations may use binary-to-thermometer encoding and/or DEM algorithms to improve the effective signal-to-noise ratio of a modulator.

Although specific features have been enumerated above, various embodiments may include some, none, or all of the enumerated features. Additionally, other features may become readily apparent to one of ordinary skill in the art after review of the following figures and description.

BRIEF DESCRIPTION OF THE DRAWINGS

For a more complete understanding of the present writing and its features, reference is now made to the following description taken in conjunction with the accompanying drawings, in which like reference numerals represent like parts.

FIGS. 1c and 1d illustrate an embodiment of a 2-bit DEM DAC system and an associated graph of the output of the system, according to a prior art (Galton, Ibid).

FIGS. 1e and 1f illustrate a table of DEM encoding or mapping sequences according to a prior art (Galton, Ibid).

FIG. 4 illustrates a binary-to-thermometer encoding table representative of the outputs of one of the binary-to-thermometer encoders of FIG. 3;

FIG. 8a illustrates an implementation of an interleaver or a dynamic routing network with a collection of switches and a DEM encoder at a first time, according to an embodiment of the present writing.

FIG. 8b illustrates an implementation of an interleaver or a dynamic routing network with a collection of switches and a DEM encoder at another time according to an embodiment of the present writing.

DETAILED DESCRIPTION

Figure 1A:
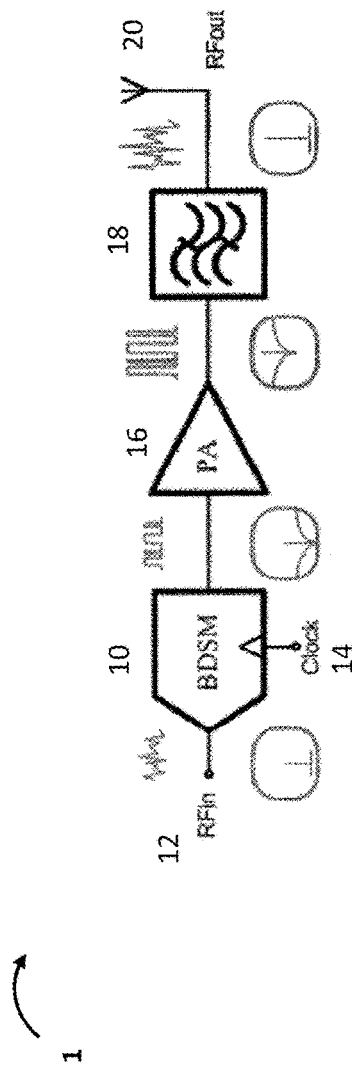
FIG. 1a illustrates a bandpass delta-sigma modulator based RF Transmitter according to prior art (Scheytt)
Figure 1B:
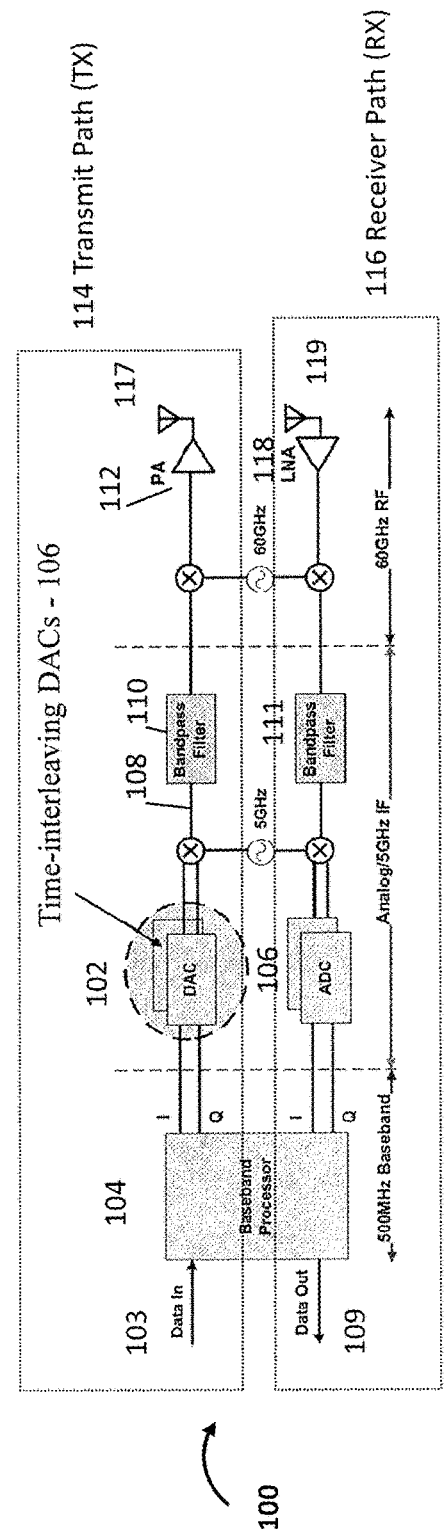
FIG. 1b illustrates a time-interleaved DAC based RF Transceiver, according to prior art (Pham)

Although example embodiments are illustrated, the proposed technology can be implemented using any number of techniques, whether currently known or not. The proposed technology should in no way be limited to the example implementations, drawings, and techniques illustrated herein. Additionally, the drawings are not necessarily drawn to scale.

To attempt to overcome the limitations of the prior art, this writing provides several embodiments for an interleaved, delta-sigma modulator for a rapidly switching multi-mode, wide-band transmitter architecture. This writing also presents a novel, software-defined, transmitter architecture based on an interleaved, delta-sigma modulator to generate RF signals. The proposed architecture leverages interleaving concepts to allow the relaxation of subcomponent clock rates without changing the effective oversampling ratio, thus, making it easier to reach aggressive dynamic range goals across wider bandwidths at higher frequencies.

Some of the features of the proposed technology include: time-interleaving delta-sigma modulator DAC configurations to enable a high-dynamic-range operation at high RF carrier frequencies; a DEM algorithm to randomize mismatch errors across all interleaved paths; and a tunable bandpass filter to further reject out-of-band emissions.

Existing transmitter configurations are either not reconfigurable, or if they are reconfigurable, they cannot achieve high-dynamic-range performance over wide-band operation. The proposed architecture uses a modulator capable of generating RF signals with variable bandwidths over a broad band of carrier frequencies enabling use in multi-band, multi-mode applications. Current delta-sigma, modulator-based transmitter architectures have limited bandwidths because of performance degradation at the high clock rates needed to achieve high oversampling ratios. In the present technology, multiple signal paths of the modulator are time-interleaved which reduces the operating rate of the subcomponents while maintaining a high effective clock rate.

In this writing, the word "permute" can take on the definition "submit to a process of a permutation", wherein the word "permutation" takes on the definition "an arrangement or rearrangement of the elements of a set", wherein permuting the elements can yield the originally ordered elements of the set, but can also not yield the originally ordered elements of the set. For example, permuting the bits in the set {0,1} can yield {1,0} or {0,1}. If a DEM encoder has inputs labeled input0 and input1, and the DEM encoder is inputted with a digital signal having bits with the order {0,1} at input0 and input1 (or perhaps at a single input carrying both bits), respectively, its output is a permutation of the inputted bits. Therefore, it can be one of: {1,0} or {0,1}, at the outputs labeled output0 and output1, wherein its inputs have a one-to-one correspondence with its outputs. The bits outputted by the DEM encoder are defined as "permuted bits". The identity permutation, or the permutation that leaves the order of the bits unchanged, can be accomplished in various ways known in the art of DEM encoding. The permuted bits are received by the DAC and the DAC converts the permuted bits according to the permutation thereof such that different permutations activate different converting elements within the DAC. The permuted bits are converted to a corresponding analog signal by the DAC.

In this writing, the use of the language "digital signal having bits" means a digital signal representing more than one bit. The digital signal should be interpreted in the broadest way possible and can be embodied as an electrical signal, optical signal, etc., virtually any type of signal or physical quantity conveying information in a form representing or having quantized values or bits. The bits that the digital signal represents form an ordered sequence or arrangement. A single digital signal can be transmitted, transported, or conveyed in a variety of ways such as in: a single path or multiple paths. If a digital signal is transmitted or received via multiple paths, it is understood that the bits transmitted or received via multiple paths can form an ordered sequence or arrangement, which represents digital information.

In this writing, the use of the terms "interleaver", "interleaving device", "dynamic coupler", "interleave control", "interleave controller", "dynamic router" and "dynamic router system" all relate to the same system. However, a "coupler" can be read to be different than a "dynamic coupler".

In this writing, the term "dynamic" or "dynamically" refers to something which changes with time.

Figure 2:
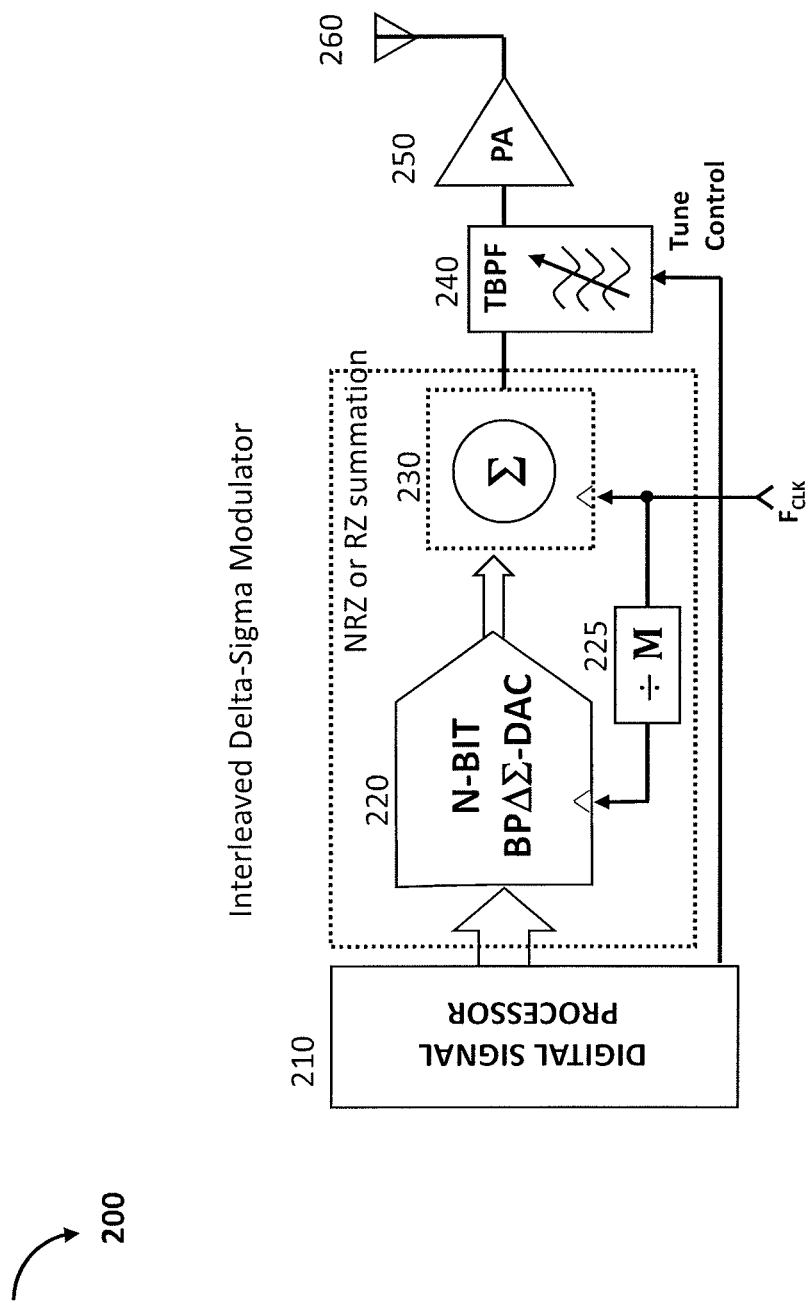
FIG. 2 illustrates an interleaved delta-sigma modulator based RF transmitter architecture, according to an embodiment of the present writing.

In the embodiment in FIG. 2, an interleaved, delta-sigma-modulator-based RF transmitter architecture system 200 is disclosed. Herein, it will be often referred to simply as a "transmitter" or "system". The main blocks of the transmitter 200 are a digital signal processing unit 210 that provides low-speed digital modulation data to an interleaved bandpass delta-sigma digital-to-analog converter (DAC) 220, which generates a RF carrier signal from modulation data and shapes noise away from the carrier signal to achieve a desired dynamic range performance within the signal band. The signal proceeds from the DAC 220 to summation block or summing circuit 230 described in greater detail below. An optional, tunable bandpass filter 240 can be included to filter the signal to reduce out-of-band emissions. The RF carrier signal is amplified by a power amplifier (PA) 250 for broadcasting through an antenna 260. The interleaved delta-sigma modulator based RF transmitter architecture system 200 of FIG. 2 effectively increases the clock rate of the system and boosts the oversampling ratio, which in turn improves the achievable signal-to-noise ratio and the dynamic range of the system. In FIG. 2, unit 225 is a clock dividing unit.

In order to enable the interleaving architecture of system 200, an interleaving DEM algorithm can be used. Unlike a conventional DEM algorithm that arranges the bits in cells in one DAC, the interleaving DEM algorithm must consider bits in cells routed to all of the interleaving DACs and route the bits in cells to ensure that there is no periodic pattern of routed pathways or encoded digital bits within those cells.

The core of the interleaved delta-sigma modulator based RF transmitter architecture system 200 is the bandpass delta-sigma DAC 220 and the interleaving that there occurs achieves remarkable dynamic range performance over wideband operation. A block diagram of the bandpass delta-sigma DAC 220 of FIG. 2 is shown in more detail in FIG. 3. DSP 210 from FIG. 2 provides digital information to a filter block 322 which is a parallel, noise-shaping digital filter comprised of parallel infinite impulse response (IIR) filters 320 followed by time-interleaved noise shaping loop filters integral therein.

In more specificity, the parallel noise-shaping digital filter that is filter block 322 comprises a K-to-M multiplexer 321 that multiplexes K inputs into M outputs of N bits each. The output of the filter block 322 is multiple IF data sets of N-bit wide vectors where M is the interleave factor and N is the number of DAC bits. N can vary from vector to vector, though it is fixed in the preferred embodiment. The M is determined by the limitations of technology and packaging limitations. How many parallel paths can be used is determined by the hardware limitations of the technology. For example, in today's CMOS technology, a factor of (M=) 2 to 32 is easily achievable, and M usually takes on a value of $2^1$, $2^2$, $2^3$, etc. Here, an "input" is defined as a coupled path that receives a collection of bits in a certain arrangement. An "output" is defined as a coupled path that outputs a collection of bits in a certain arrangement.

Figure 3:
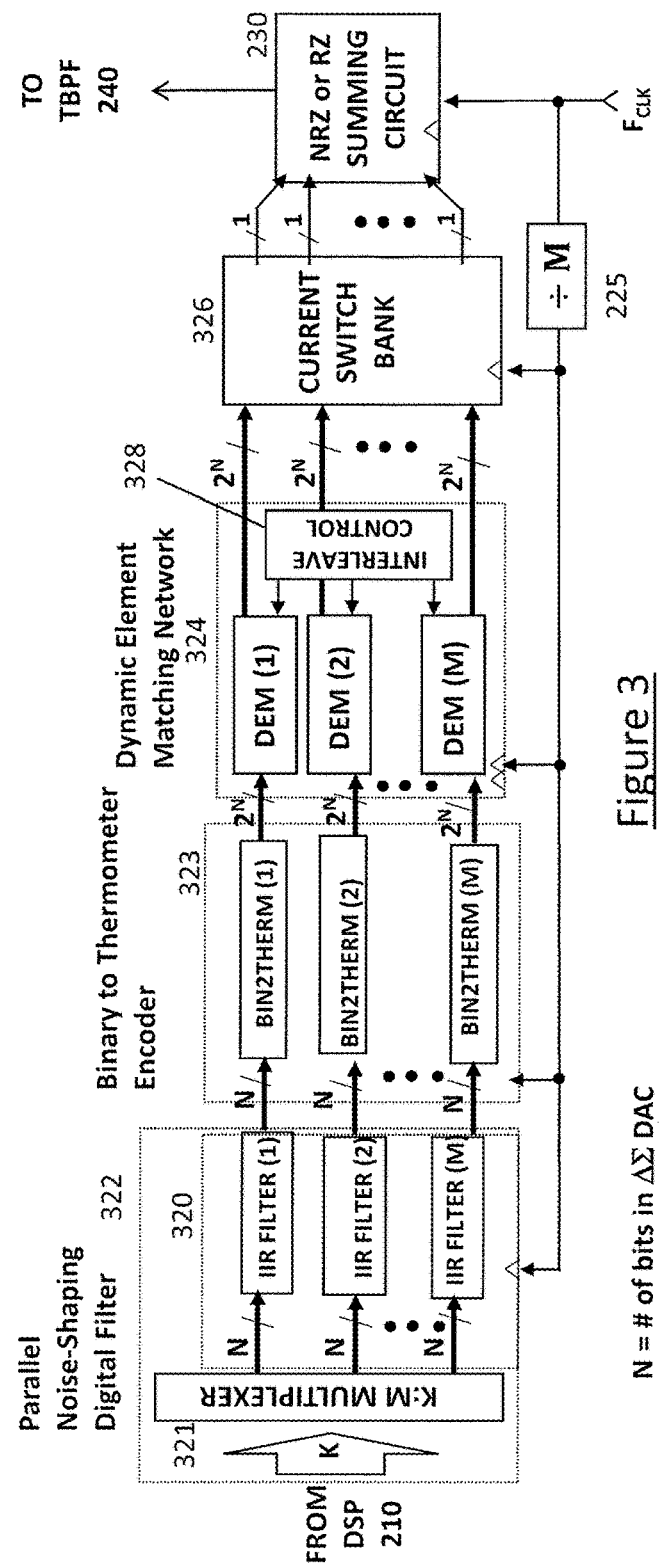
FIG. 3 illustrates a detailed block diagram of FIG. 2, according to an embodiment of the present writing.

Each one of the M data sets is processed along the transmit chain in parallel and sampled at equal sub-phases of a clock with frequency $F_{CLK}/M$ as seen in FIG. 3 with clock dividing circuit 225. The binary information in each data set is first converted to thermometer code by binary-to-thermometer encoders in block 323 and then scrambled or permuted by a DEM encoder/unit in the DEM network 324 comprising M blocks of DEM units to reduce mismatch errors. In FIG. 3, DEM(1), for example, receives $2^N$ bits outputted from IIR Filter (1), and outputs a permutation of the $2^N$ bits. The $2^N$ bits are then dynamically routed with the interleave control unit 328 to a $2^N$-bit DAC of current switch bank 326. Unlike conventional DEM algorithms, which arrange the cells in one path of a DAC, the interleaving DEM algorithm must consider the cells used in all of the interleaved paths and arrange them to ensure that there is no periodic pattern. That is, the interleaving DEM algorithm must scramble (or shuffle) the digital bits present within a digital signal and interleave the digital signals with scrambled bits into a set of pathways to ensure that there is no periodic pattern of routed pathways or digital bits within those pathways.

Figure 6:
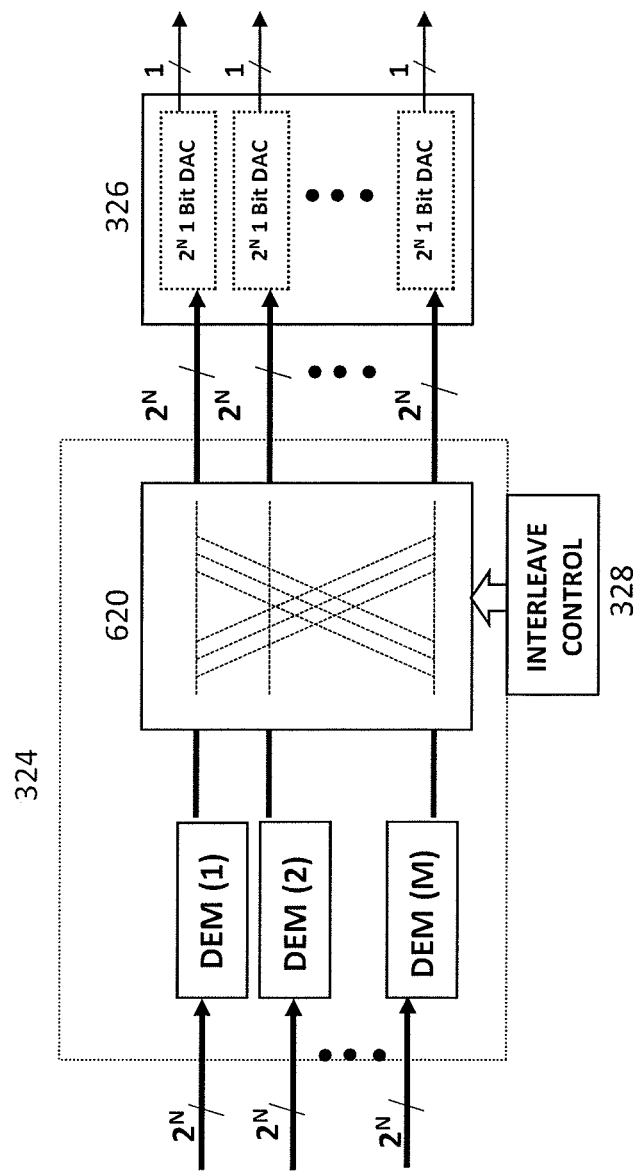
FIG. 6 illustrates an interleaved, dynamic, element-matching network after mapping in FIG. 3, according to an embodiment of the present writing.

The binary-to-thermometer encoder block 323 converts each data sets of N bits to corresponding data sets of $2^N$ bits. Hence, at the output of the binary-to-thermometer encoder block 323, each data set is $2^N$ bits in width or size. Each thermometer coded data set is passed through a DEM encoder of DEM network 324 to then be interleaved with interleave control 328 and routed to current switch bank 326. The thermometer code drives a bank of unit current switches in current switch bank 326 to generate a representative analog current value. The current switch bank 326 operates at a frequency of $F_{CLK}/M$ and comprises M banks of $2^N$ 1 bit-DACs that convert the digital signals to the analog domain. This is shown in FIG. 6 discussed in more detail in later paragraphs.

The DEM network 324 acts to scramble the bits in this portrayal.

The currents from all of the interleaved paths exiting the current switch bank 326 are combined in the summation block or summing circuit 230 of FIG. 2 and again depicted in FIG. 3. Binary-to-thermometer encoding is used to create a monotonic signal (or likewise to prevent voltage spikes) when currents are combined. The most straightforward way to combine the time-interleaved current outputs is to use a return-to-zero (RZ) summation technique. An alternative approach that can be considered is a nonreturn-to-zero (NRZ) circuit, which requires more processing but has the benefit of not introducing signal glitching caused from shutting off currents.

It is important to note that with the exception of the output summation block or summing circuit 230, all other subcomponents of the transmitter 200 are allowed to operate at a reduced clock rate of $F_{CLK}/M$, though this is not a strict requirement; subcomponents can each be operating at a unique clock rate and can be connected to individual clocks or portions of the subcomponents can be connected to individual clocks. Interleaving in this presentation of embodiments affords more flexibility in making trade-offs between power and speed. The subcomponent designs do not approach the limits of the technology, so that they do not degrade performance nor demand a disproportionately higher power to operate at full clock speed.

The parallel noise-shaping digital filter 322 of FIG. 3 can be programmed to have single or multiple passing/rejection bands to support single or multiple carrier signals for 4G LTE standards. Since the filter coefficient is programmable, this architecture is suitable to support the next generation carrier requirements with proper software upgrading.

Figure 5:
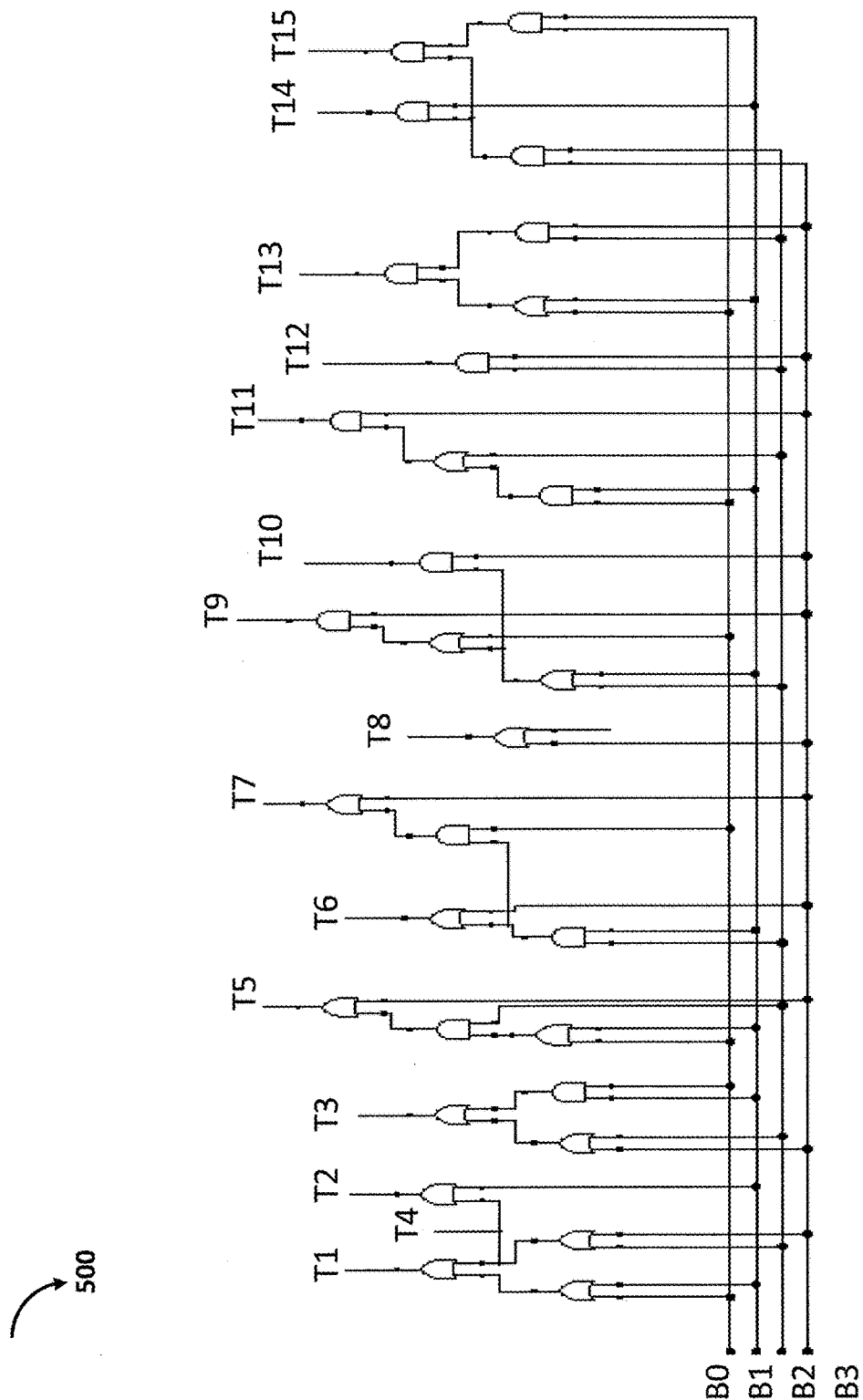
FIG. 5 illustrates an implementation of the code mapping of FIG. 4.

FIG. 4 illustrates a typical binary-to-thermometer table that is representative of the outputs of the binary-to-thermometer encoder block 323 of FIGS. 2 and 3. The logic block 500 of FIG. 5 illustrates a typical implementation of the code mapping of FIG. 4, which maps an N-bit vector to a $2^N$-bit vector. A binary-to-thermometer encoder can comprise any implementation of a set of logic gates or a programmable circuit to obtain the mapping of FIG. 4. The logic block 500 decodes binary code B0:3 to T1:15. T0 (not shown) is active when B0:3 are all zeroes.

After the mapping in binary-to-thermometer encoder block 323, the M signals with bits labeled T0:T15 are presented to M DEM encoders in the DEM network 324. Interleaving then occurs with interleave control 328 seen in FIG. 3 and explored in greater detail later in FIGS. 6, 7, 8a and 8b. The significance of interleaving is of note.

Many DAC architectures use matched references, comparators, and current switches for signal conversion. DACs typically comprise nominally matched components such as resistors, capacitors, current switches, transistors, and analog-to-digital converters (ADCs). Manufacturing processes often cannot generate components, which have identical electrical properties. Further, temperature differences between components (perhaps due to their positions relative to each other or other components) can also cause them to operate differently. The need to deal with such differences is present. The component value deviations, (called mismatch errors), create DAC signal conversions with mismatch errors. DEM algorithms dynamically rearrange the interconnections or couplings to the matched and mismatched components of, for example, a DAC, so that any possible interconnection is available during the process of a signal conversion. A DEM encoder works to dynamically and possibly randomly activate converting elements within a DAC. If the matched and mismatched components' activations are appropriately varied, the harmonic distortion caused by the mismatched components can be reduced and the frequency can be shifted or eliminated. These components, often referred to as "cells", are dynamically rearranged using different DEM algorithms.

Figure 7:
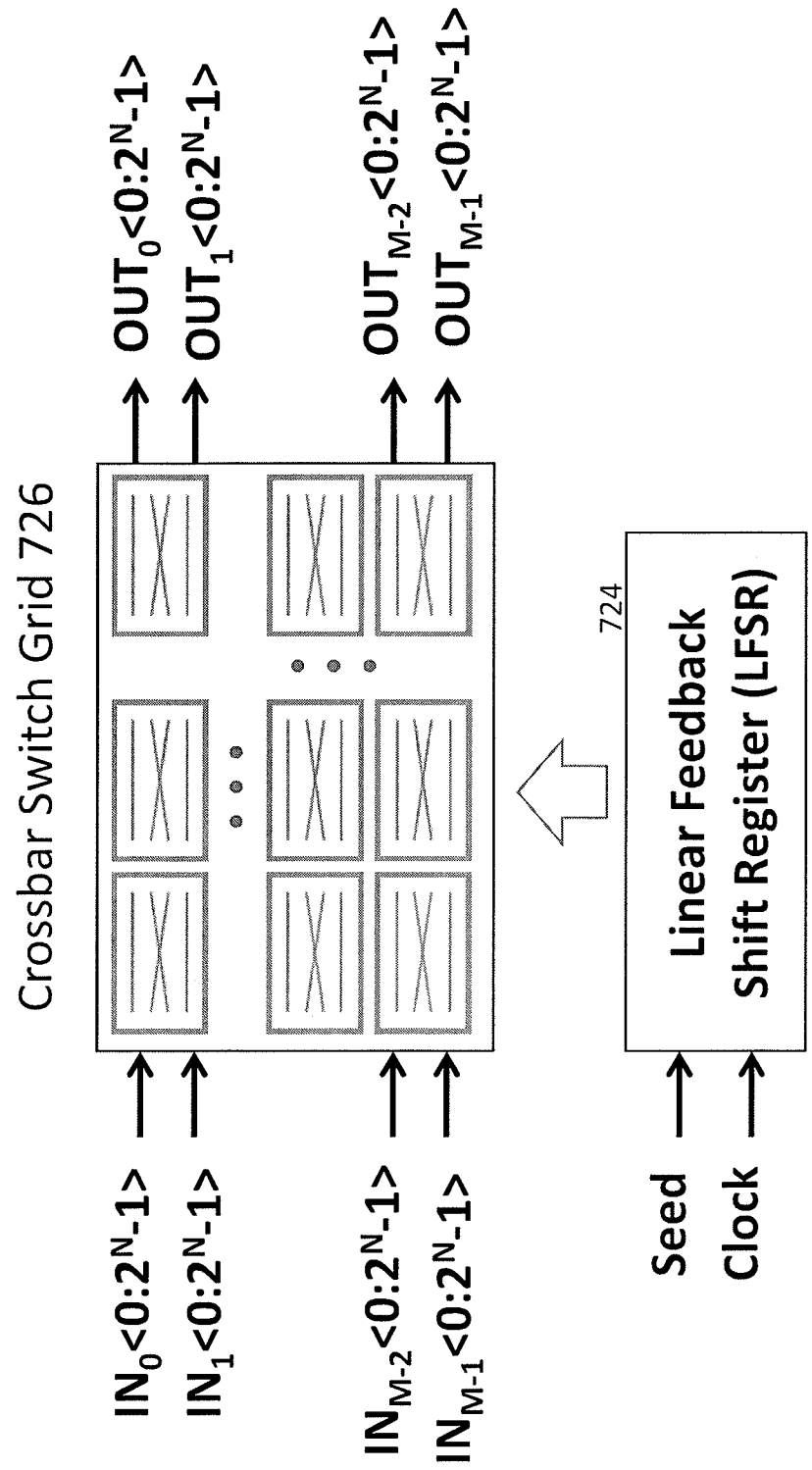
FIG. 7 illustrates an implementation of a crossbar switch grid and a linear feedback shift register for interleaving received data according to an embodiment of the present writing.

Digital DEM algorithms have been used in multi-bit oversampling ADC feedback paths in DACs to correct the DAC's non-uniform quantization intervals. Without these digital DEM algorithms, multi-bit DACs in oversampling ADC feedback paths are prone to produce more noise. Presented in FIGS. 6, 7, 8a and 8b is a randomized DEM algorithm used to uniformly or randomly distribute mismatch errors through the M interleaved paths and DEM encoders before feeding the 1-bit DACs present in current switch bank 326. Interleave control 328, which provides a second level of DEM as distinguished from the DEM encoders that permute bits, can involve a crossbar switch grid 620 or 726 as seen in FIGS. 6 and 7 respectively, or the collection of switches 820 as seen in FIGS. 8a and 8b. The latter cooperates with DEM encoder 810, the former cooperates with Linear Feedback Shift Register (LFSR) 724. DEM encoder 810 in the interleave control 328 is used to reroute bits rather than scramble them as is done in the DEM encoders of the DEM 324 in FIG. 3.

The M DEM encoder outputs (and in one embodiment, inputs) of the DEM network 324 are routed with the interleave control unit 328. The interleave control unit 328 as above noted, scrambles the paths at grid 620 going to or from the DEMs in DEM network 324 to reduce mismatch error. Unlike conventional DEM algorithms, which arrange the cells in one DAC, the interleaving DEM algorithm of 620 must consider the cells used in all of the interleaved paths and arrange them to ensure that there is no periodic pattern of interconnections. After scrambling the bits in the inputs of the DEM encoders in the DEM network 324, the M sets of $2^N$ digital bits are dynamically routed with the interleave control and converted to analog signals by the DACs in the current switch bank 326 which comprise unit cells of 1-bit DACs as earlier noted.

In FIG. 7, by processing M signals each with N bits through interleaving, one can reduce the logic clock frequency by the order of M—the interleaving factor. LFSR 724 receives a seed that generates pseudo random bits to control a crossbar switch grid 726. The pseudo random bits are used to control multiplexing in the signal propagation path and to provide randomness to the propagation paths. The scrambling of the bits helps randomize the mismatch noise so that the mismatch noise can be effectively filtered out. The interleaving in the DEM algorithm accounts for the cells used in all of the interleaved paths and arranges them to ensure that there is no periodic pattern of pathways or couplings to the DACs. It should be noted that several embodiments of the invention include having M DEMs coupled to B binary-to-thermometer encoders, wherein M is not necessarily equal to B and B can be zero, equal to M or even greater than M. The number M is at least one. The B binary-to-thermometer encoders encode a plurality of digital signals substantially or fully in parallel, though the number of digital signals being thermometer encoded is not necessarily equal to B and can be at least one or any number up to B. One embodiment can include configuring only a portion of all of the DEMs to operate at any given time, with some digital samples or a portion of the digital samples being unchanged or not considered by any DEM encoders throughout an operation of the transmitter at a given instance. The portion of DEM encoders that operate at any given time can be dynamically changed from sample to sample of digital signals. In one embodiment, the M DEM encoders do not operate identically and, for example, each can be configured to operate on digital data of varying length or constant length and each can uniquely scramble or shuffle the digital data in a digital signal. Each DEM can be designed with a unique combination of components or algorithms. However, in a practical embodiment, the M DEMS are designed with nominally identical components and algorithms and all operate on M digital signals of the same length substantially or fully in parallel, though it should be restated that the number of available DEMS can be larger than the number of digital signals that are being operated on substantially or fully in parallel. In this context, a digital signal or digital data can be of a certain length of bits. In one practical embodiment, the digital signals of a certain length can each be at least two bits, though they can be one bit or much larger. The larger the size of a digital signal, the greater the complexity in the corresponding binary-to-thermometer encoder used to facilitate the mapping of that digital signal to thermometer code. This greater complexity can come in the form of a larger number of components and interconnections in the binary-to-thermometer encoder. The term "parallel" used herein refers to the parallel arrangement of the digital signals, digital signal pathways, DEM encoders, or potentially any other components comprised by the transmitter such that the digital signals in all pathways propagate at the same clock rate, nearly the same clock rate, a factor of a given clock rate, or nearly a factor of a given clock rate. For example, two digital signals are propagating in parallel if they are being routed towards two DACs and one signal is propagating at double the clock rate the second signal is propagating. They are propagating in parallel if one signal is propagating at nearly double the clock rate the second signal is propagating.

As above noted, interleaver 328 in this writing can be referred to as an interleave system, dynamic coupler, coupler, interleave control, dynamic router or a dynamic router network and can be embodied as a number of different units. In one embodiment, the interleaver can be a dynamic routing network comprised of a collection of switches 820 or a crossbar switch grid 620, 726. The collection of switches 820 can be controlled with the LFSR 724, as in FIG. 7, that generates randomized switch selector bits to turn on and turn off certain switches for routing the digital signals in parallel. The collection of switches can also be controlled by DEM encoder 810, which is discussed hereunder. The collection of switches can comprise transistors, metal wires, relays, mechanical switches, thermal switches, optical switches, and virtually any conceivable embodiment of a collection of switches. A portion or all of the switches can be controlled in a randomized or pseudo randomized manner. The interleaver dynamically routes M digital signals to M signal pathways that are coupled to DACs. The total number of available signal pathways to the DACs can be greater than M. The total number of available DACs can be greater than M and they may not all be utilized at any given time. For example, a collection of digital signals $\{In_0, In_1, In_2\}$ can be mapped to three of the signal pathways in {$Out_0$, $Out_1$, $Out_2$, $Out_3$, $Out_4$} according to a randomized method or non-randomized method. Since two of the signal pathways are not utilized, their corresponding coupled DACs are not utilized and thus, do not receive digital signals. The signal pathways that receive the digital signals are non-dynamically coupled to corresponding DACs in one embodiment.

In one embodiment of the invention, the interleave control unit 328 is configured such that the digital signals are interleaved or dynamically routed before they are encoded by the DEM encoders of DEM network 324, wherein the DEM encoders receive dynamically routed digital signals and subsequently encode them. In another embodiment, the interleaver unit is configured such that the digital signals are interleaved or dynamically routed after they are encoded by the DEM encoders. In one embodiment the DEM encoders receive thermometer encoded digital signals before the DEM-encoded digital signals are received by the DACs. A more complex algorithm could entail dynamically selecting between 1) DEM encoding the digital signals and then interleaving the DACs with the digital signals or 2) interleaving digital signal pathways with the collection of switches and then DEM encoding the digital signals. The only embodiment shown in the drawings is with the signals going to the Dynamic Element Matching Network 324 first before being interleaved, but this is not a limiting situation and can be changed as here noted.

Turning now again to FIGS. 8a and 8b, these Figures illustrate an implementation of an interleaver or a dynamic routing network wherein the bits 1's and 0's within the boxes represent on and off switches 820 that are configured to dynamically couple each input to a corresponding output.

In FIG. 8a, bits 1:N from $In_0$ are all routed to $Out_0$. This method is carried through to all inputs such that bits 1:N from an input $In_i$ are all routed to an output $Out_i$. FIG. 8b illustrates, in perhaps another point in time or sampling, a collection of switches 820 that have dynamically been selected to turn off and turn on by a control unit, and to re-route the inputs to another set of outputs. In FIG. 8b, bits 1:N from input $In_0$ are all routed to output $Out_4$. Bits 1:N from input $In_1$ are all routed to $Out_2$. Bits 1:N from input $In_2$ are all routed to $Out_0$. It should be noted that the number of bits N could vary from input to input, though N bits enter an input of the interleaver and the same number of N bits output the interleaver. The interleaver does not scramble the bits 1:N in a single path; it merely re-routes them in order. The interleaver however, can become more complex and re-route a portion of a digital signal, bits 1:M to one path and the other bits M+1:N to another path using two switches and recombine their signals at the DAC stage. Controlling of the interleaver can be implemented using a DEM encoder 810 to control the collection of switches 820 in the interleaver or the dynamic routing network, as illustrated in FIGS. 8a and 8b, where the interleave system includes DEM encoder 810 and the collection of switches 820. The collection of switches 820 is coupled to P available output paths and M available input paths, wherein the amount of available output paths is not necessarily equal to the amount of available input paths, though they are equal in a practical embodiment. The amount of switches in one embodiment is P×M, though this is not strictly necessary and is dependent upon the complexity and design of each switch. As stated in the Background section herein, a 2-bit DEM encoder works to swap or not swap two bits in a random decision-making manner and a combination of 2-bit DEM encoders can be configured to operate on N bits. Similarly, a higher order bit DEM encoder can be used to swap, scramble or leave unchanged, the couplings of the input-output paths in a random decision-making manner or a manner according to a sequence of a random decision-making manner. Swapping two paths can amount to swapping bits or turning on and off certain switches in the collection of switches. Any combination of 2-bit or larger DEM encoders can be used to facilitate the swapping or scrambling of input-output paths. For example, if inputs are routed according to $In_i \rightarrow Out_j$ and $In_m \rightarrow Out_n$ (Switch labeled i, j=1 and Switch labeled m, n=1), these two paths can be swapped such that the inputs are subsequently routed according to $In_i \rightarrow Out_n$ and $In_m \rightarrow Out_j$ (Switch labeled i, n=1 and Switch labeled m, j=1, with the previously mentioned switches turned off). DEM Encoder 810 considers this re-routing or interleaving for all paths at a given instance such that all paths are considered for re-routing substantially in parallel. Each output of N bits is coupled to either corresponding DACs or N-bit DEM encoders for further encoding of the N bits. The interleaver of the present application therefore, introduces a higher level of DEM encoding to the processing of the digital signals therein.

Figure 9:
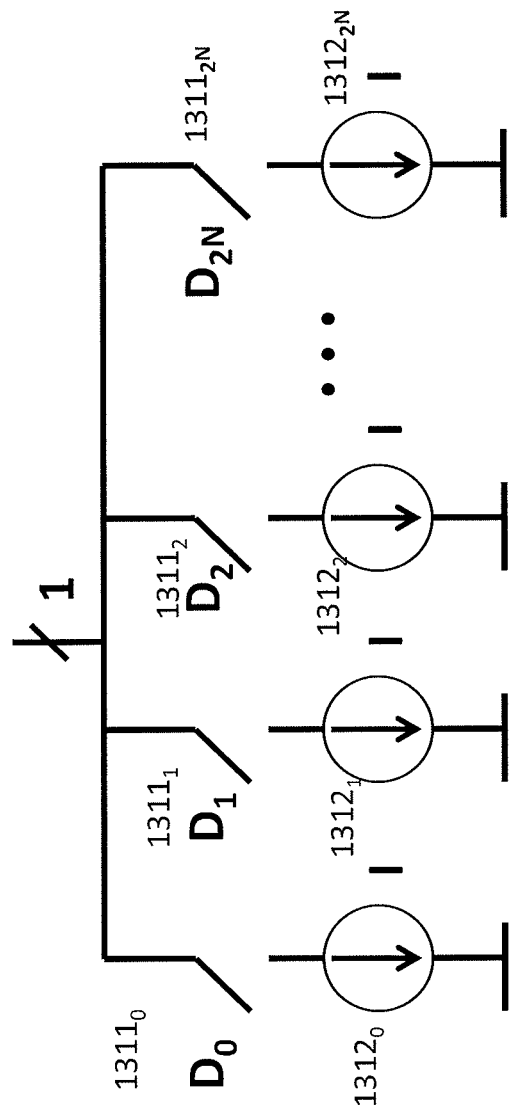
FIG. 9 illustrates an implementation of a portion of the current switch bank 326 as first indicated in FIG. 3, according to an embodiment of the present writing.

Now turning to FIG. 9 which is a portion of the switch bank 326, there is seen a collection of $2^N$ switches $1311_0$-$1311_{2^N}$ that are coupled to corresponding current sources $1312_0$-$1312_{2^N}$. The $2^N$ bits from the data signal are used to turn off or turn on the switches $1311_0$-$1311_{2^N}$ to the current sources $1312_0$-$1312_e$. For example, for a 4-bit thermometer coded data signal D1:D4="0011" with bits coupled to switches $1311_0$-$1311_3$ respectively, two switches $1311_2$ and $1311_3$ could be turned on to generate an analog signal generated from two current sources for that data signal. Current sources are the symbols labeled by $1312_i$ and a single current switch can be defined as the combination of, for example, switch $1311_i$ and current source $1312_i$. The outputs of the M $2^N$ bit DACs are received at the summing circuit 230 in FIG. 3, which further processes the M analog signals generated from the M DACs. The summing circuit 230 can use any scheme known in the art, such as NRZ or RZ modulation techniques. The clock-dividing unit 225 provides the frequency $F_{CLK}/M$ to the current switch bank 326.

The current switch bank 326 of FIG. 3 can comprise a collection of 1-bit DACs, and can be configured to convert a digital signal of a certain length to an analog signal using a series of current switches. As presented here, the number of 1-bit DACs is equal to the size of the digital signal being converted to analog, i.e., the number of bits carried in that digital signal, though the amount of available 1-bit DACs can be greater than the size of the digital signal. A 1-bit DAC can be embodied as a single current source switch as seen in FIG. 9. Each digital bit in a digital signal turns on or turns off a switch $1311_i$ in the current switch bank 326 and an analog signal is generated by the resulting combined current wherein the combined current is representative of or corresponds to the digital signal.

The plurality of DACs in the switch bank 326 can also be any collection of DACs, segmented or not segmented, and can comprise binary-weighted DACs and thermometer-coded or unary DACs, or a hybrid thereof. These DACs comprise current sources $1312_0$-$1312_{2^N}$ coupled to switches $1311_0$-$1311_{2^N}$ wherein the current sources are not all identical and can include a pattern of current sources. For example, a binary-weighted DAC comprises a series of varying resistors used to generate a specific series of current sources of varying currents. In an embodiment with segmented or hybridized DAC configurations, unary weighted bits would be scrambled independently of the binary weighted bits. Across paths, the binary bits of equal weight can be scrambled but must drive the current switch that represents the correct weight. This embodiment would be less effective because of the constrained scrambling but offers less complexity because fewer switches are needed. An ideal unary DAC comprises a collection of identical switches coupled to identical current sources.

The proposed technology provides for an interleaved, delta-sigma modulator for a rapidly switching multi-mode, wide band transmitter architecture in the various fields of communications and this technology will benefit in the areas of ground radio, software defined radio (SDR), smart radio, cognitive radio, in-vehicle communications, in-car/in-plane infotainment systems, compact automobile sensors etc. This technology also provides for novel software defined transmitter architecture based on an interleaved delta-sigma modulator to generate RF signals in the field of radio transmitters among other benefits.

In particular configurations, it can be desirable to have tunable band pass filters at the output of the delta-sigma modulator. In other applications the tunable filter can be omitted. In some configurations, a general purpose processor can be used instead of the DSP to feed the delta-sigma modulator. This concept can be used with additional pre-processing or additional filtering as needed for various applications.

Modifications, additions, or omissions can be made to the systems, apparatuses, and methods described herein without departing from the scope of the technology. The components of the systems and apparatuses can be integrated or separated. Moreover, the operations of the systems and apparatuses can be performed by more, fewer, or other components. The methods can include more, fewer, or other steps. Additionally, steps can be performed in any suitable order. As used in this document, "each" refers to each member of a set or each member of a subset of a set.

What is claimed is:

1. A transmitter comprising:
   a dynamic element matching (DEM) system having an output, wherein the DEM system is configured to receive bits of data and output a permutation of the bits of data at its output;
   at least two digital-to-analog converters (DACs) each having an input and output;
   a coupler, wherein the coupler comprises a crossbar switch grid to couple the input of at least one of the DACs of the at least two DACs to the output of the DEM system, and wherein the at least one of the DACs is configured to output an analog signal corresponding to the permutation of the bits of data.

2. The transmitter of claim 1 further comprising a summing circuit having inputs coupled to the outputs of the at least two DACs;
   wherein the bits of data comprises sets of bits of data;
   wherein the DEM system comprises more than one DEM encoder;
   wherein the number of DACs is at least equal to the number of DEM encoders;
   wherein the output of the DEM system comprises outputs of the DEM encoders such that each DEM encoder of the more than one DEM encoder has an output, and the more than one DEM encoder are configured to receive the sets of bits of data and output permutations of the sets of bits of data at corresponding outputs;
   wherein the crossbar switch grid is configured to couple the inputs of the DACs to the outputs of the DEM encoders such that the DACs are interleaved and output the analog signals corresponding to the permutations of the bits of data; and
   wherein the summing circuit is configured to combine the analog signals.

3. The transmitter of claim 1 wherein the transmitter is a Delta-Sigma modulator based radio transmitter.

4. The transmitter of claim 1 wherein the DEM system comprises a combination of coupled two-bit DEM encoders.

5. The transmitter of claim 1, wherein the permutation of the bits of data is pseudorandomly generated and wherein the coupler is configured to pseudorandomly and dynamically couple the input of the at least one of the DACs to the output of the DEM system.

6. The transmitter of claim 2 wherein the more than one DEM encoder and the DACs are each arranged in parallel.

7. The transmitter of claim 6, wherein the crossbar switch grid comprises a collection of switches that is configured to couple and uncouple the inputs of the DACs to the outputs of the DEM encoders.

8. The transmitter of claim 7, wherein the coupler further comprises at least one DEM encoder coupled to the collection of switches, and wherein the collection of switches is controlled with the at least one DEM encoder, the at least one DEM encoder being configured to pseudorandomly and dynamically turn on and turn off selected switches of the collection of switches to couple and uncouple the inputs of the DACs to the outputs of the DEM encoders.

9. The transmitter of claim 7, wherein the coupler further comprises a linear feedback shift register (LFSR) coupled to the collection of switches, wherein the collection of switches is controlled with the LFSR configured to output pseudo-randomized switch selector bits configured to turn off and turn on selected switches of the collection of switches to couple and uncouple inputs of the DACs to the outputs of the DEM encoders.

10. The transmitter of claim 2, further comprising:
    binary-to-thermometer encoders having inputs and outputs, the outputs being coupled to the inputs of the more than one DEM encoder and wherein the sets of bits of data are thermometer encoded.

11. The transmitter of claim 10, wherein each DAC of the at least two DACs is a unary DAC comprising more than one 1-bit DACs.

12. The transmitter of claim 10, further comprising:
    infinite impulse response (IIR) filters, having inputs, with outputs coupled to the inputs of the binary to thermometer encoders, the IIR filters comprising noise-shaping loop filters and being configured to have multiple passing and rejection bands.

13. The transmitter of claim 12, further comprising a K-to-M multiplexer with M outputs coupled to the inputs of the IIR filters.

14. The transmitter of claim 13, wherein the IIR filters are programmed to have multiple passing and rejection bands.

15. The transmitter of claim 2, wherein the summing circuit is a Non-Return-to-Zero (NRZ) summing circuit.

16. The transmitter of claim 2 wherein the summing circuit is a Return-to-Zero (RZ) summing circuit.

17. The transmitter of claim 15, further comprising a tunable band pass filter coupled to the summing circuit which cooperates with the summing circuit to reject emissions from the summing circuit.

18. The transmitter of claim 1
    wherein the bits of data comprise sets of bits of data;
    wherein the DEM system comprises at least two DEM encoders;

wherein the output of the DEM system comprises outputs of the at least two DEM encoders;

wherein the DEM encoders are configured to receive the sets of bits of data and output permutations of the sets of bits of data at corresponding outputs;

wherein the crossbar switch grid is configured to couple the inputs of the at least two DACs to the outputs of the at least two DEM encoders; and wherein the at least two DACs are configured to output analog signals corresponding to the permutations of the sets of bits of data.

19. A transmitter comprising:

a dynamic element matching (DEM) system comprising:
    at least two DEM encoders having outputs, wherein the DEM encoders receive bits of data and output permutations of the bits of data at corresponding outputs;

at least two DACs having inputs coupled to outputs of the DEM encoders;

a coupler having inputs and outputs; the outputs of the coupler being coupled to the inputs of the at least two DEM encoders; wherein the coupler dynamically couples the inputs of the coupler to the outputs of the coupler wherein the DACs output analog signals corresponding to the permutations of the bits of data, and wherein the coupler comprises a crossbar switch grid to dynamically couple the inputs of the coupler to the outputs of the coupler.

20. A method of converting digital data to analog data comprising:

receiving bits of data at a DEM encoder having an output;

outputting a permutation of the bits of data at the output of the DEM encoder;

coupling the output of the DEM encoder to an input of a crossbar switch grid;

coupling an input of a DAC of at least two DACs to an output of the crossbar switch grid;

converting the permutation of the bits of data to a corresponding analog signal with the DAC of the at least two DACs.

21. A transmitter comprising:

dynamic element matching (DEM) encoders having outputs, wherein each one of the DEM encoders is configured to receive a set of bits of data and output a permutation of the set of bits of data at one of the outputs;

digital-to-analog converters (DACs) each having an input and output;

a coupler, wherein the coupler is configured to couple the inputs of the DACs to the outputs of the DEM encoders, and wherein the DACs are configured to output analog signals corresponding to the permutations of the sets of bits of data;

wherein the number of DACs is at least equal to the number of DEM encoders;

wherein the coupler is configured to couple the inputs of the DACs to the outputs of the DEM encoders such that the DACs are interleaved with respect to time.

22. The transmitter of claim 21, further comprising a summing circuit having inputs coupled to the outputs of the DACs, wherein the summing circuit is configured to combine the analog signals.

23. A transmitter comprising:

dynamic element matching (DEM) encoders having outputs, wherein each one of the DEM encoders is configured to receive a set of bits of data and output a permutation of the set of bits of data at one of the outputs;

digital-to-analog converters (DACs) each having an input and output;

a coupler, wherein the coupler is configured to couple the inputs of the DACs to the outputs of the DEM encoders, and wherein the DACs are configured to output analog signals corresponding to the permutations of the sets of bits of data, wherein the coupler comprises a crossbar switch grid configured to couple the inputs of the two DACs to the outputs of the DEM encoders.

* * * * *